United States Patent
Isogai

(10) Patent No.: US 9,224,779 B2
(45) Date of Patent: Dec. 29, 2015

(54) IMAGING APPARATUS WITH SENSOR CHIP AND SEPARATE SIGNAL PROCESSING CHIPS

(75) Inventor: Tadao Isogai, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 331 days.

(21) Appl. No.: 13/819,092

(22) PCT Filed: Aug. 23, 2011

(86) PCT No.: PCT/JP2011/068950
§ 371 (c)(1),
(2), (4) Date: Feb. 26, 2013

(87) PCT Pub. No.: WO2012/026457
PCT Pub. Date: Mar. 1, 2012

(65) Prior Publication Data
US 2013/0153751 A1     Jun. 20, 2013

(30) Foreign Application Priority Data

Aug. 27, 2010   (JP) ................... 2010-191058
Aug. 27, 2010   (JP) ................... 2010-191059

(51) Int. Cl.
*H01L 27/146* (2006.01)
*H04N 5/369* (2011.01)

(52) U.S. Cl.
CPC .... *H01L 27/14636* (2013.01); *H01L 27/14618* (2013.01); *H04N 5/369* (2013.01); *H01L 2924/0002* (2013.01)

(58) Field of Classification Search
CPC combination set(s) only.
See application file for complete search history.

(56) References Cited

U.S. PATENT DOCUMENTS

| 5,672,902 A | 9/1997 | Hatanaka et al. |
| 2002/0119658 A1 | 8/2002 | Honda et al. |
| 2006/0214086 A1* | 9/2006 | Fukushima ............... 250/208.1 |
| 2007/0064129 A1 | 3/2007 | Suzuki |

FOREIGN PATENT DOCUMENTS

| JP | A-64-005172 | 1/1989 |
| JP | A-2000-269472 | 9/2000 |
| JP | A-2000-340778 | 12/2000 |
| JP | A-2002-270859 | 9/2002 |
| JP | A-2003-189195 | 7/2003 |
| JP | A-2006-229798 | 8/2006 |

(Continued)

OTHER PUBLICATIONS

Nov. 8, 2011 International Search Report issued in International Application No. PCT/JP2011/068950 (with translation).

(Continued)

*Primary Examiner* — Francis M Legasse, Jr.
(74) *Attorney, Agent, or Firm* — Oliff PLC

(57) ABSTRACT

An imaging apparatus includes a sensor chip, a substrate, upper and lower signal processing chips and connection boards. The sensor chip has pad electrodes to which electrical signals to be supplied to a pixel array are input. The substrate has first wiring patterns connected to signal lines, to which signals of the pixel array are output, and second wiring patterns connected to pad electrodes. The upper and lower signal processing chips have pad electrodes to which signals processed by signal processing circuits are output. The connection boards have FPC wiring electrically connected to the pad electrodes and FPC wiring electrically connected to the second wiring patterns formed on the substrate.

25 Claims, 10 Drawing Sheets

(56) References Cited

FOREIGN PATENT DOCUMENTS

| JP | A-2007-082063 | 3/2007 |
| JP | A-2010-062283 | 3/2010 |

OTHER PUBLICATIONS

Nov. 8, 2011 Written Opinion issued in International Application No. PCT/JP2011/068950 (with translation).

Nov. 19, 2013 Office Action issued in Japanese Application No. 2010-191058 (with translation).

Nov. 19, 2013 Office Action issued in Japanese Application No. 2010-191059 (with translation).

Mar. 9, 2015 Office Action issued in Chinese Application No. 201180037445.1.

Sep. 25, 2015 Office Action issued in Chinese Application No. 201180037445.1.

* cited by examiner

IMAGING APPARATUS WITH SENSOR CHIP AND SEPARATE SIGNAL PROCESSING CHIPS

TECHNICAL FIELD

The present invention relates to an imaging apparatus which captures a subject image.

Priority is claimed on Japanese Patent Application Nos. 2010-191058 and 2010-191059, filed Aug. 27, 2010, the content of which is incorporated herein by reference.

BACKGROUND ART

In the related art, in a sensor chip including a pixel array which converts incident light to electrical signals, a so-called bare chip mounting structure in which a chip is mounted directly on a glass substrate is known. In the bare chip mounting structure, the electrical signals output from the sensor chip are output outside the glass substrate through wiring patterns provided on the glass substrate (for example, see Patent Documents 1 and 2).

In recent years, in a large sensor chip which is used in a so-called digital single lens reflex camera, there is demand for a higher-speed operation, and an A/D converter is provided for each column of the pixel array on the same chip to perform signal processing in parallel, thereby suppressing the processing speed of the A/D converter to be comparatively lower and thus achieving low power consumption. However, in order to achieve higher-speed processing, since a sensor unit which has a large dynamic range with low noise and a high power supply voltage and a digital circuit in which a fine transistor is provided to perform an ultra high-speed operation with a lower power supply voltage are constituted by a single chip, a manufacturing process becomes complicated, and yield is degraded. During a high-speed operation, heat generation of the chip, especially, heat generation of the A/D converter, may increase, thereby causing degradation in image quality or the like in the pixel array due to a rise in temperature.

For this reason, in order to block heat transfer from the A/D converter to the pixel array, a so-called multi-chip mounting structure in which a signal processing unit including an A/D converter and a pixel array are constituted by individual chips and mounted on a single glass chip may be made.

In this case, a sensor chip is disposed substantially at the center of the substrate, and an FPC (flexible printed circuit board) or the like is connected to an external connection portion on one side of the glass substrate. The signal processing chip is disposed between the sensor chip and the external connection portion, and multiple signal lines from the signal processing chip are connected to the external connection portion. Power for driving the sensor chip to be supplied through the FPC, clock signals, and the like are directly supplied from the external connection portion to the sensor chip through pattern wiring on the glass substrate.

CITATION LIST

Patent Document

[Patent Document 1] Japanese Unexamined Patent Application, First Publication No. 2010-62283
[Patent Document 2] Japanese Unexamined Patent Application, First Publication No. 2002-270859

SUMMARY OF INVENTION

Technical Problem

However, in the imaging apparatus of the related art, the external connection portion and the sensor chip are disposed separately, and line resistance of the pattern wiring on the glass substrate is comparatively higher. For this reason, variation in reference potential or the like occurs due to an increase in line resistance of the power supply, and the operation of the sensor chip becomes unstable, causing deterioration in image quality. If the pattern wiring on the glass substrate increases in thickness to achieve low resistance, mounting restrictions occur. This causes a problem in that the glass substrate increases in size, for example.

An object of an aspect of the invention is to provide an imaging apparatus capable of reducing wiring resistance to suppress deterioration in image quality.

Solution to Problem

An imaging apparatus according to an aspect of the invention includes a sensor chip having a pixel array in which a plurality of pixels are arranged to output signals according to incident light to signal lines, and input terminals to which electrical signals to be supplied to the pixel array are input, a substrate which is disposed on the light-receiving surface side of the sensor chip, and on which first wiring patterns electrically connected to the signal lines and second wiring patterns electrically connected to the input terminals are formed, signal processing chips which have signal processing circuits which process the signals input through the first wiring patterns, and output terminals to which the signals processed by the signal processing circuits are output, and connection boards which have first wiring electrically connected to the output terminals of the signal processing chips and second wiring electrically connected to the second wiring patterns formed on the substrate.

According to this aspect, in order to perform a high-speed operation, the sensor chip and the signal processing chip are provided on the same substrate, the signals output from the pixel array of the sensor chip are processed by the signal processing circuits of the signal processing chips, and the signals processed by the signal processing chips are transmitted outside the substrate through the external connection portions. For example, when power or the like necessary for driving the sensor chip through the external connection portions is supplied directly to the pixel array through the second wiring patterns, and when the second wiring having line resistance lower than the second pattering wiring formed on the substrate is routed close to, for example, the input terminals of the sensor chip, the total length of the second pattern wiring can be reduced, thereby reducing line resistance as a whole. For this reason, for example, it is possible to suppress deterioration in image quality due to line resistance without causing an increase in the size of the substrate.

An imaging apparatus according to another aspect of the invention includes a sensor chip having a pixel array in which a plurality of pixels are arranged to output signals according to incident light to signal lines, and input terminals to which electrical signals to be supplied to the pixel array are input, a substrate which is disposed on the light-receiving surface side of the sensor chip, and on which first wiring patterns electrically connected to the signal lines and second wiring patterns electrically connected to the input terminals are formed, signal processing chips which have signal processing circuits which process the signals input through the first wiring patterns, output terminals to which the signals processed by the signal processing circuits are output, and wiring layers which are electrically connected in parallel to the second wiring patterns, and external connection portions which have first wiring electrically connected to the output terminals of the signal processing chips and second wiring electrically connected to the second wiring patterns formed on the substrate.

According to this aspect, in order to perform a high-speed operation, the sensor chip and the signal processing chip are provided on the same substrate, the signals output from the pixel array of the sensor chip are processed by the signal processing circuits of the signal processing chips, and the signals processed by the signal processing chips are transmitted outside the substrate through the external connection portions. And, when power or the like necessary for driving the sensor chip through the external connection portions is supplied directly to the pixel array through the second wiring patterns, the wiring layers of the signal processing chip are effectively used, and the wiring layers are provided to be connected to the wiring layers in the middle of the second wiring patterns, thereby reducing line resistance by the wiring layers of low resistance compared to a case where only the second wiring patterns on the substrate are used. For this reason, for example, it is possible to suppress deterioration in image quality due to line resistance without causing an increase in the size of the substrate.

DESCRIPTION OF EMBODIMENTS

Next, an imaging apparatus according to an embodiment of the invention will be described with reference to the drawings.

Figure 1:
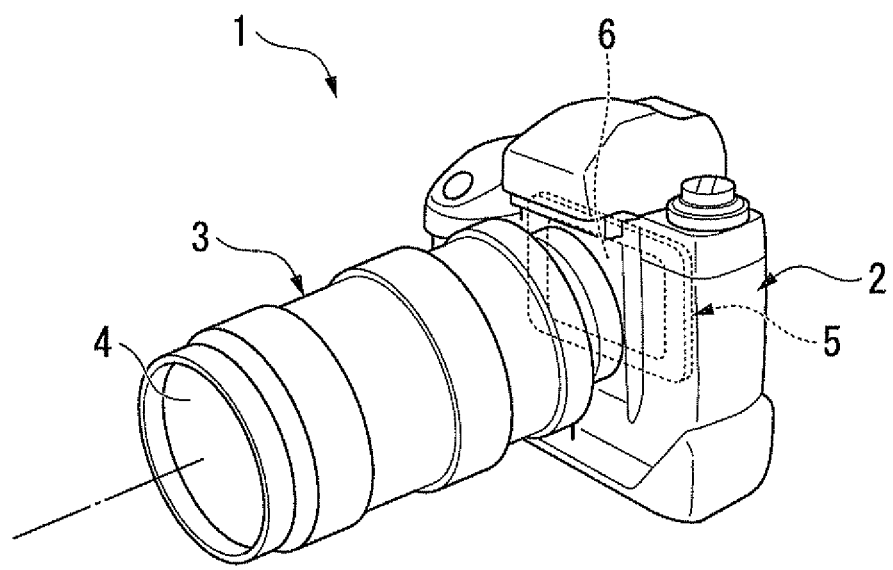
FIG. 1 is a perspective view of an imaging apparatus according to an embodiment of the invention.

FIG. 1 shows an imaging apparatus 1 of this embodiment. The imaging apparatus 1 is a so-called digital single lens reflex camera. A lens barrel 3 is detachably attached to a lens mount (not shown) of a camera body 2, and light which passes through a lens 4 of the lens barrel 3 is focused on a sensor chip 6 of a multi-chip module 5 disposed on the rear side of the camera body 2. The sensor chip 6 is a chip, such as a so-called CMOS image sensor.

Figure 2:
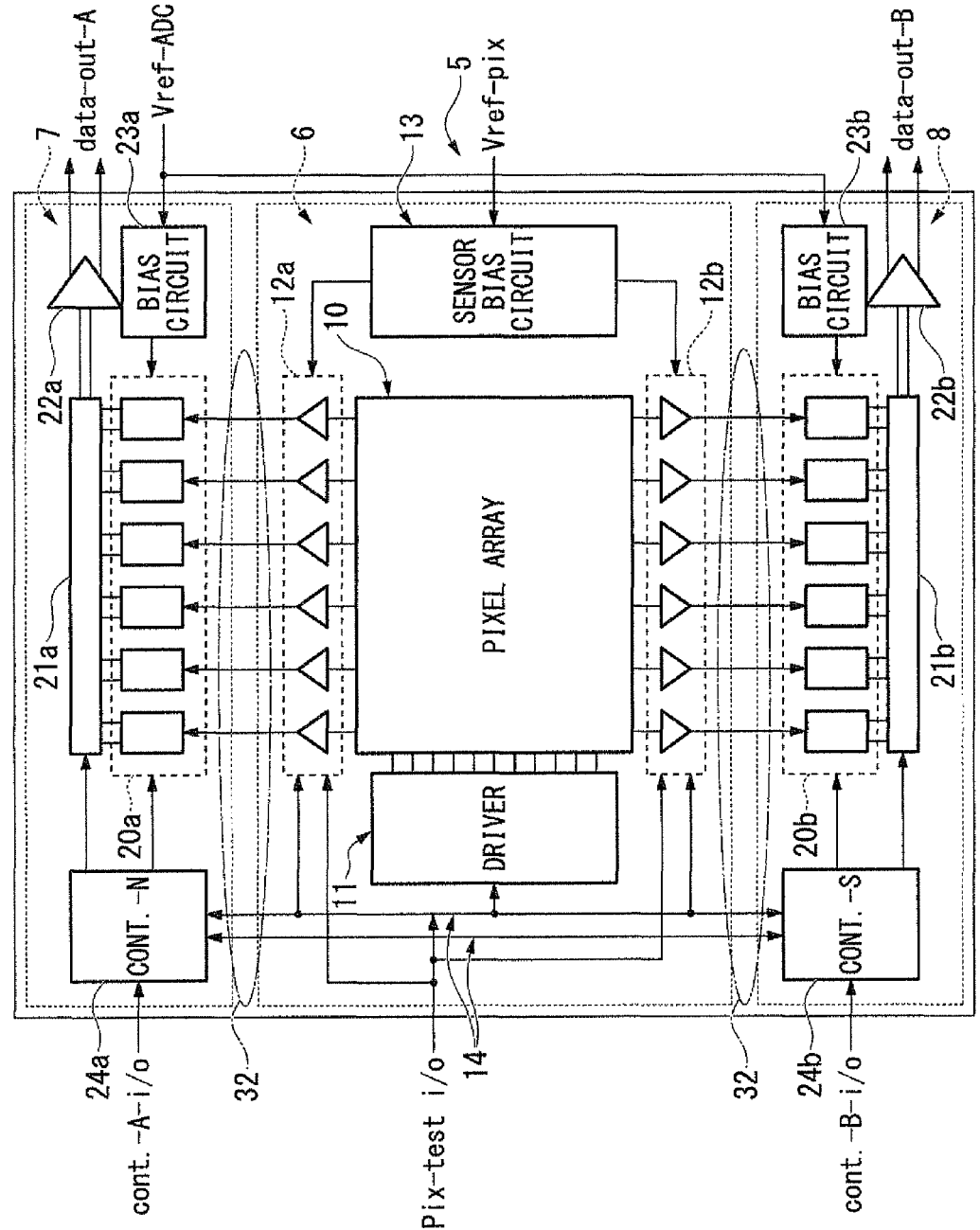
FIG. 2 is a block diagram showing the schematic configuration of a multi-chip module according to the embodiment of the invention.

FIG. 2 shows the multi-chip module 5. The multi-chip module 5 includes a sensor chip 6, an upper signal processing chip 7, and a lower signal processing chip 8.

The sensor chip 6 includes a pixel array 10 which has a plurality of pixels arranged in a two-dimensional manner along a column direction and a row direction to output signals (hereinafter, simply referred to as pixel signals) according to incident light, a pixel driver 11 which drives the pixel array 10, two column amplifiers 12a and 12b which amplify the output of the pixel array 10, and a sensor bias circuit 13 which supplies bias reference voltage and current mainly to the column amplifiers 12a and 12b of the sensor chip 6 based on a control signal (Vref-pix) from the outside. The sensor chip 6 further includes a driving control bus 14 for the pixel driver 11, and the driving control bus 14 is also connected to the upper signal processing chip 7 and the lower signal processing chip 8.

Of the column amplifiers 12a and 12b, the column amplifier 12a amplifies the pixel signals of the odd-numbered columns of the pixel array 10 in parallel for the respective columns and outputs the amplified pixel signals to the upper signal processing chip 7. The column amplifier 12b amplifies the pixel signals of the even-numbered columns of the pixel array 10 in parallel for the respective columns and outputs the amplified pixel signals to the lower signal processing chip 8.

The upper signal processing chip 7 includes as signal processing circuits for processing input signals, a plurality of analog digital converters (hereinafter, simply referred to as column ADCs) 20a which digitally convert analog electrical signals for the respective columns output from the column amplifier 12a of the a sensor chip 6 in parallel, a digital output bus 21a for digital signals output from the column ADCs 20a, a digital small-amplitude differential output circuit 22a which reduces the amplitude of the signals of the digital output bus 21a and differentially transmits (data-out-A) the signals outside the chip, a bias circuit 23a of the column ADCs 20a, and a control circuit (CONT.-N) 24a which controls the column ADCs 20a, the digital output bus 21a, the digital small-amplitude differential output circuit 22a, and the bias circuit 23a.

Similarly, the lower signal processing chip 8 includes, as signal processing circuits for processing input signals, a plurality of column ADCs 20b which digitally convert analog electrical signals for the respective columns output from the column amplifiers 12b of the sensor chip 6 in parallel, a digital output bus 21b for digital signals output from the column ADCs 20b, a digital small-amplitude differential output circuit 22b which reduces the amplitude of the signals of the digital output bus 21b and differentially transmits (data-out-B) the signals outside the chip, a bias circuit 23b of the column ADCs 20b, and a control circuit (CONT.-S) 24b which controls the column ADCs 20b, the digital output bus 21b, the digital small-amplitude differential output circuit 22b, and the bias circuit 23b.

A control signal (Pix-test i/o) for an operation test of the multi-chip module 5 is inputtable to the control circuits 24a and 24b, the pixel driver 11, and the column amplifiers 12a and 12b from the outside.

Next, the operation of the multi-chip module 5 having the above-described chip configuration will be described. Description of the operation of the operation test will be omitted.

First, if a control signal is input from the outside of the multi-chip module 5 through two control lines (in FIG. 2, represented by "cont.-A-i/o" and "cont.-B-i/o"), the control signal is input to the pixel driver 11 through the driving control bus 14 by at least one of the control circuit 24a of the upper signal processing chip 7 and the control circuit 24b of the lower signal processing chip 8. When this happens, the pixel array 10 is driven by the pixel driver 11, and the pixel signals selected row by row are input in parallel to the column amplifiers 12a and 12b for the respective columns. The pixel signals input to the column amplifiers 12a and 12b are applied with a necessary gain and then output from the sensor chip 6. The pixel signals output from the sensor chip 6 are input to the upper signal processing chip 7 and the lower signal processing chip 8 through wiring patterns 32 (in FIG. 2, wiring encircled with a two-dot-chain line) formed in parallel for the respective columns. The upper signal processing chip 7 and the lower signal processing chip 8 have the same configuration and perform the same operation except that the output signals of the pixel array 10 to be input thereto are even-numbered or odd-numbered. For this reason, the upper signal processing chip 7 will be hereinafter described, and description of the lower signal processing chip 8 will be omitted.

The pixel signals input to the upper signal processing chip 7 are input in parallel to the column ADCs 20a for the respective columns and subjected to analog-digital conversion based on the control signal of the control circuit 24a. The digital pixel signals subjected to analog-digital conversion are input to the digital small-amplitude differential output circuit 22a through the digital output bus 21a on the basis of the control signal of the control circuit 24a, reduced in amplitude, and differentially output (in FIG. 2, represented by "DATA-OUT-A"). The output ("DATA-OUT-A" and "DATA-OUT-B") from the upper signal processing chip 7 and the lower signal processing chip 8 is output in a predetermined sequence set in advance, and the digital pixel signals output from the upper signal processing chip 7 and the lower signal processing chip 8 are transmitted outside the multi-chip module 5 through first wiring patterns 32b and flexible printed boards (connection boards and external connection portions) F described below.

Although in the above description, a case where the digital small-amplitude differential output circuits 22a and 22b are provided in the upper signal processing chip 7 and the lower signal processing chip 8 has been described, the invention is not limited thereto. For example, a plurality of (a plurality of lanes of) digital small-amplitude differential output circuits 22a to 22n may be provided in accordance with a necessary pixel output speed, and digital pixel signals may be transmitted while an output sequence is switched by the control circuit 24a or the control circuit 24b. Although in the column ADCs 20a and 20b, a case where only analog-digital conversion is performed has been described, the invention is not limited thereto. For example, if necessary, signal processing circuits which perform enhanced digital calculation may be embedded to perform data offset value addition, fixed pattern noise (FPN) subtraction correction, and calculation for correcting error variations of the column ADCs 20a and 20b.

Figure 3A:
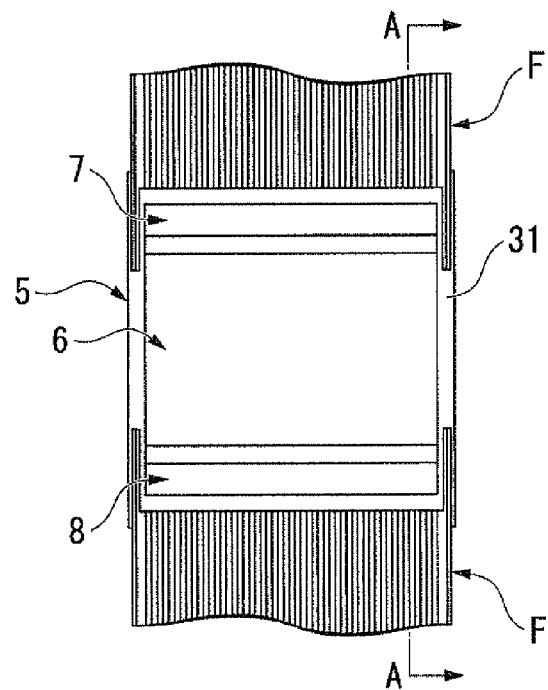
FIG. 3A is a front view showing a multi-chip module according to the embodiment of the invention.
Figure 3B:
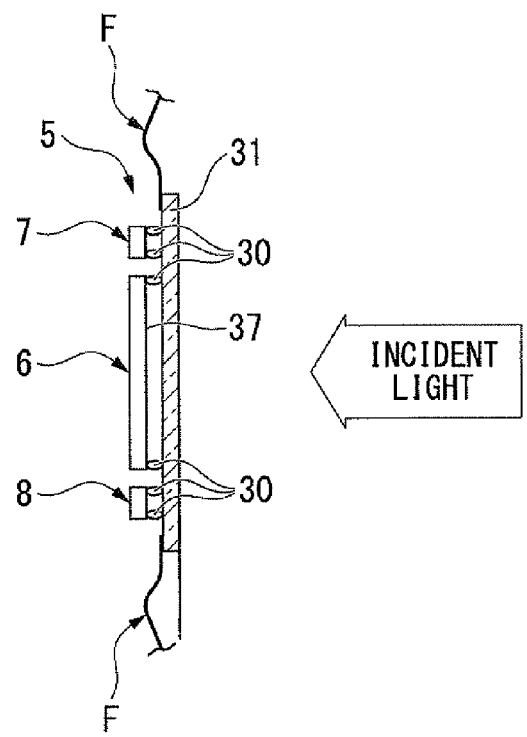
FIG. 3B is a partial sectional view taken along the line A-A of FIG. 3A.

In this embodiment, as shown in FIGS. 3A and 3B, the multi-chip module 5 has a so-called bare chip mounting structure in which the sensor chip 6 is mounted directly on a transparent glass substrate 31 disposed on a light-receiving surface 37 side of the sensor chip 6 through bumps 30. The glass substrate 31 is formed to substantially have a rectangular plate shape in which the column direction of the pixel array 10 (see FIG. 4) becomes a longitudinal direction, and the sensor chip 6 is mounted substantially at the center of the glass substrate 31 in the longitudinal direction.

The sensor chip 6 is a comparatively larger sensor chip of so-called 35 mm full size or the like, and the upper signal processing chip 7 and the lower signal processing chip 8 are also mounted on the glass substrate 31 on which the sensor chip 6 is mounted. The sensor chip 6 is mounted on the glass substrate 31 through the bumps 30, such that the light-receiving surface 37 of the sensor chip 6 is disposed to be slightly separated from the glass substrate 31 by the amount corresponding to the height of the bumps 30. Sealing resin (not shown) is filled around the bumps 30 between the sensor chip 6 and the glass substrate 31, thereby securing attachment rigidity of the sensor chip 6 to the glass substrate 31 and airtightness of the light-receiving surface 37 of the sensor chip 6.

The upper signal processing chip 7 and the lower signal processing chip 8 are formed to substantially have a rectangular shape in top view along along the width direction of the glass substrate 31, and are disposed on both sides of the glass substrate 31 in the longitudinal direction centering on the sensor chip 6.

Figure 4:
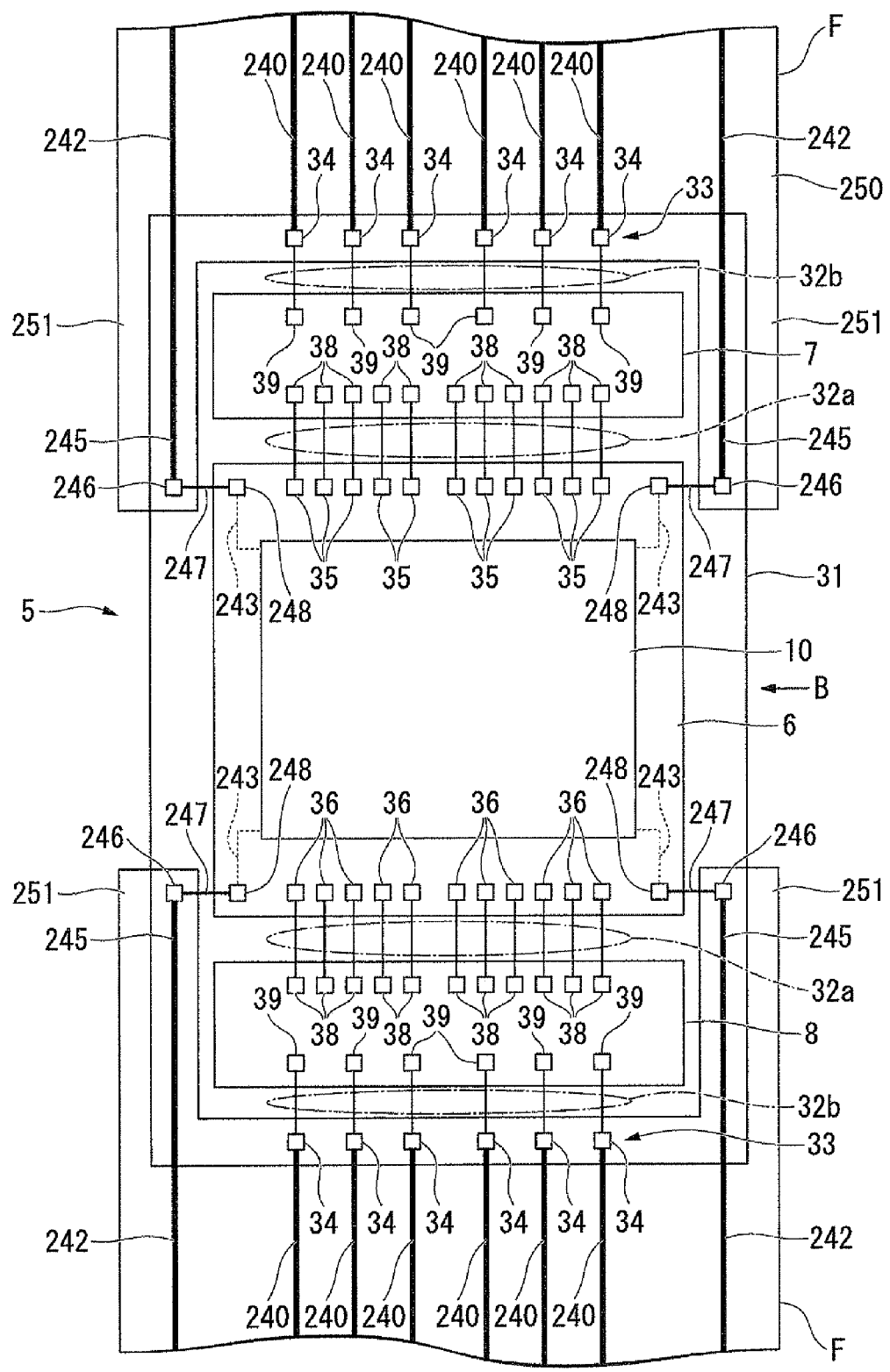
FIG. 4 is a front view showing the outline of wiring of a multi-chip module according to the embodiment of the invention.

As shown in FIG. 4, the sensor chip 6 includes a plurality of pad electrodes 35 which output the pixel signals of the odd-numbered columns of the pixel array 10 in parallel and a plurality of pad electrodes 36 which output the pixel signals of the even-numbered columns of the pixel array 10. The pad electrodes 35 of the odd-numbered columns are arranged along the edge on the upper signal processing chip 7 side, and the pad electrodes 36 of the even-numbered columns are arranged along the edge on the lower signal processing chip 8 side. In this embodiment, a plurality of signal lines (not shown) to which the pixel signals of the pixel array 10 are output are provided in the sensor chip 6, and the column amplifiers 12a and 12b are disposed in the middle of the signal lines. The pad electrodes 35 and 36 are connected to the end portions of the signal lines on the opposite side to the pixel array 10. The pad electrodes 35 and 36 are connected to one end of first wiring patterns 32a formed on the glass substrate 31 through the bumps 30 (see FIG. 3B).

The upper signal processing chip 7 and the lower signal processing chip 8 include a plurality of pad electrodes 38 arranged along the long side on the sensor chip 6 side, and a plurality of pad electrodes 39 arranged along the long side on the opposite side to the sensor chip 6. The pad electrodes 38 are connected to the other end of the first wiring patterns 32a through the bumps 30. The pad electrodes 38 are connected to the input sides of the above-described signal processing circuits, and the pad electrodes 39 are connected to the output sides of the signal processing circuits. The pad electrodes 39 are connected to one end of first wiring patterns 32b through the bumps 30.

In this way, the pad electrodes 38 are arranged along the long sides of the upper signal processing chip 7 and the lower signal processing chip 8 and disposed to face the pad electrodes 35 and 36 of the sensor chip 6, thereby connecting the first wiring patterns 32a having thousands of wiring arranged in parallel at the shortest distance. Although the first wiring patterns 32a to which the pixel signals are output from the sensor chip 6 are thousands of wiring in the odd-numbered columns or the even-numbered columns, for convenience of illustration, in FIG. 4, the first wiring patterns 32a to which the pixel signals of the pixel array 10 are output are shown in a simplified form.

A plurality of pad electrodes 34 are arranged on the glass substrate 31 at the edge on the opposite side to the sensor chip 6 and the edge of the lower signal processing chip 8 on the opposite side to the sensor chip 6 so as to be substantially parallel to the arrangement direction of the pad electrodes 39.

The other end of the first wiring patterns 32b is connected to a plurality of pad electrodes 34, and a plurality of pad electrodes 34 constitute external connection terminals 33.

The flexible printed boards F which are connected to the outside the glass substrate 31 are connected to the external connection terminals 33. The flexible printed boards F integrally include a plurality of FPC wiring 240 (first wiring) which are flexible, substantially formed to have a linear shape, and substantially arranged in parallel. One end of the plurality of FPC wiring 240 is connected to a plurality of pad electrodes 34. Accordingly, the digitally converted pixel signals are output outside the multi-chip module 5 through the pad electrodes 34 and the FPC wiring 240.

The flexible printed boards F include FPC wiring 242 for supplying electrical signals, such as the driving power of the pixel array 10, to the pixel array 10, in addition to the FPC wiring 240.

Figure 5:
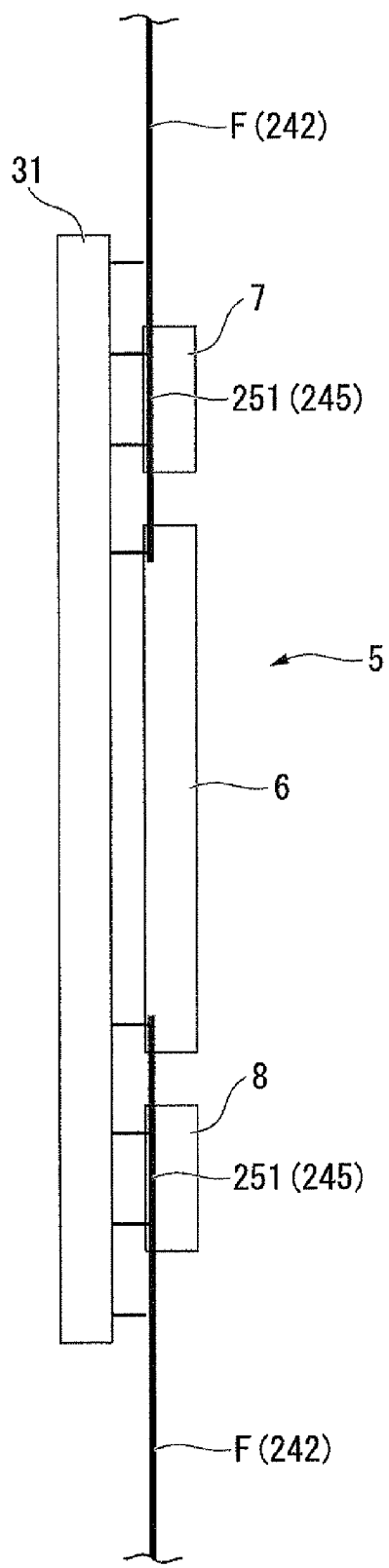
FIG. 5 is an arrow view when viewed from a B direction of FIG. 4 according to the embodiment of the invention.

As shown in FIGS. 4 and 5, each flexible printed board F includes a substrate body 250 which is formed from the glass substrate 31 to a position where the external connection terminals 33 of the glass substrate 31 are formed, and extended portions 251 which extends from the substrate body 250 toward the sensor chip 6. The extended portions 251 include FPC extended wiring 245 which is formed by extending the FPC wiring 242 in the extension direction.

The end portions of the extended portions 251 are connected to pad electrodes 246 disposed on the lateral side of the sensor chip 6. That is, the end portions of the extended portions 251 are formed to extend to the lateral sides of the sensor chip 6. One end of second wiring patterns 247 formed on the glass substrate 31 is connected to the pad electrodes 246, and the second wiring patterns 247 are routed at right angles with respect to the extension direction of the FPC extended wiring 245 in top view. The other end of the second wiring patterns 247 is connected to pad electrodes 248 as the input terminals of the sensor chip 6 through the bumps 30.

The pad electrodes 248 are terminals to which electrical signals to be supplied to the pixel array 10 are input, and are connected to the pixel array 10 through signal lines 243 inside the sensor chip 6. The extended portions 251 of this embodiment extend from both left and right sides of the flexible printed boards F toward the sensor chip 6, and reaches both left and right lateral sides of the FPC sensor chip 6. Since the wiring patterns (first wiring patterns 32a and 32b and the second wiring patterns 247) formed on the glass substrate 31 have restrictions on the size of the sectional area or the like, if the length is equal, the wiring patterns usually have a resistance value greater than the FPC wiring 240 or the FPC wiring 242 by one digit.

Accordingly, in the imaging apparatus 1 of the above-described embodiment, the sensor chip 6, the upper signal processing chip 7, and the lower signal processing chip 8 are mounted on the same glass substrate 31 so as to perform a high-speed operation, the analog pixel signals converted by the pixel array 10 of the sensor chip 6 are processed in parallel for the respective columns by the upper signal processing chip 7 and the lower signal processing chip 8, and the digital pixel signals processed by the upper signal processing chip 7 and the lower signal processing chip 8 are transmitted outside the multi-chip module 5 through the FPC wiring 240 of the flexible printed boards F. When electrical signals, such as power necessary for driving the pixel array 10, are supplied directly to the sensor chip 6 through the FPC wiring 242 as the second wiring of each flexible printed board F, the extended portions 251 are formed by extending part of the flexible printed board F from the substrate body 250 of the flexible printed board F toward the sensor chip 6, the FPC extended wiring 245 which is connected to the FPC wiring 242 is provided in the extended portions 251, and wiring is routed close to the sensor chip 6 by the FPC extended wiring 245. For this reason, according to this embodiment, it is possible to reduce the second wiring patterns 247 compared to a case where the external connection terminals 33 and the sensor chip 6 are connected together using the second wiring patterns 247 on the glass substrate 31, thereby reducing wiring resistance to suppress deterioration in image quality due to wiring resistance without causing an increase in the size of the glass substrate 31.

The extended portions 251 reach the lateral sides of the sensor chip 6, such that the FPC extended wiring 245 for power supply and the pad electrodes 248 for power supply of the sensor chip 6 can be connected together at the shortest distance, thereby further reducing the second wiring patterns 247. As a result, it is possible to achieve further reduction in wiring resistance.

The extended portions 251 reach both lateral sides of the sensor chip 6, making it possible to secure the routing space of the extended wiring 245, for example, when multiple extended wiring 245 are required.

The invention is not limited to the configuration of the imaging apparatus 1 of the above-described embodiment, and design changes may be made without departing from the gist of the invention.

For example, although in the above-described embodiment, a case where the extended portions 251 reach both left and right lateral sides of the sensor chip 6 has been illustrated, the invention is not limited thereto. The extended portion 251 may be formed on one side in accordance with the position of the pad electrode 248 for power supply of the sensor chip 6. A plurality of FPC extended wiring 245 may be provided in one extended portion 251.

Although a case where the extended portions 251 reach the lateral sides of the sensor chip 6 has been described, the invention is not limited thereto. For example, it should suffice that the extended portions 251 are formed to extend from the substrate body 250 toward the sensor chip 6. The positions of the pad electrodes 246 are not limited to the lateral sides of the sensor chip 6.

Although a case where the FPC wiring 242 for supplying driving power of the pixel array 10 to the sensor chip 6 extends to suppress wiring resistance has been described, the invention is not limited thereto. FPC wiring to be extended is not limited to the driving power line, and a line into which a comparatively larger current flow may be applied. Even though a comparatively larger current does not flows, a line which has large wiring resistance and is likely to cause deterioration in image quality, for example, wiring patterns (clock lines) through which clock signals are supplied to the sensor chip 6 may extend and be connected to the sensor chip 6.

Next, another embodiment (a modification of the foregoing embodiment) will be described. In the following description, the same or equivalent portions as those in the foregoing embodiment are represented by the same reference numerals, and description thereof will be simplified or omitted.

Figure 6A:
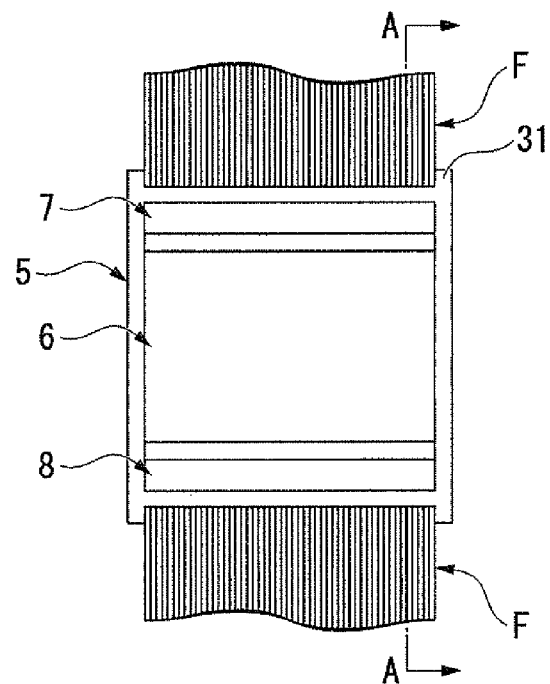
FIG. 6A is a front view showing a multi-chip module according to the embodiment of the invention.
Figure 6B:
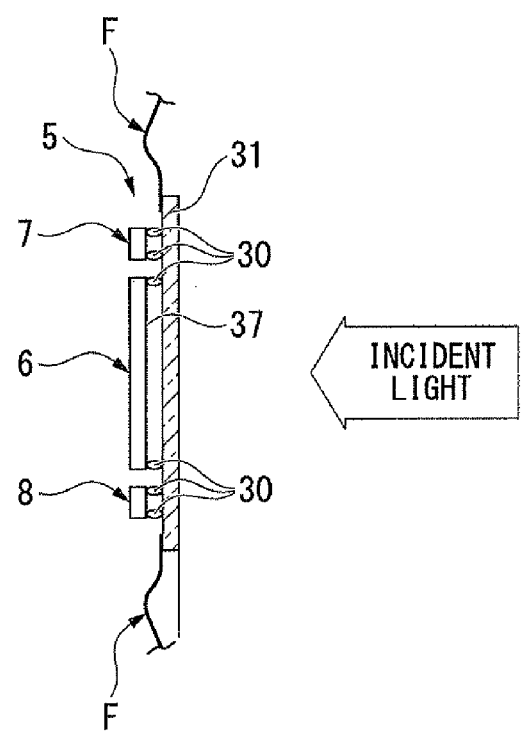
FIG. 6B is a partial sectional view taken along the line A-A of FIG. 6A.

In this embodiment, as shown in FIGS. 6A and 6B, the multi-chip module 5 has a so-called bare chip mounting structure in which the sensor chip 6 is mounted directly on the transparent glass substrate 31 disposed on the light-receiving surface 37 side of the sensor chip 6 through the bumps 30. The glass substrate 31 is formed to substantially have a rectangular plate shape in which the column direction of the pixel array 10 (see FIG. 7) becomes a longitudinal direction, and the sensor chip 6 is mounted substantially at the center of the glass substrate 31 in the longitudinal direction.

Figure 7:
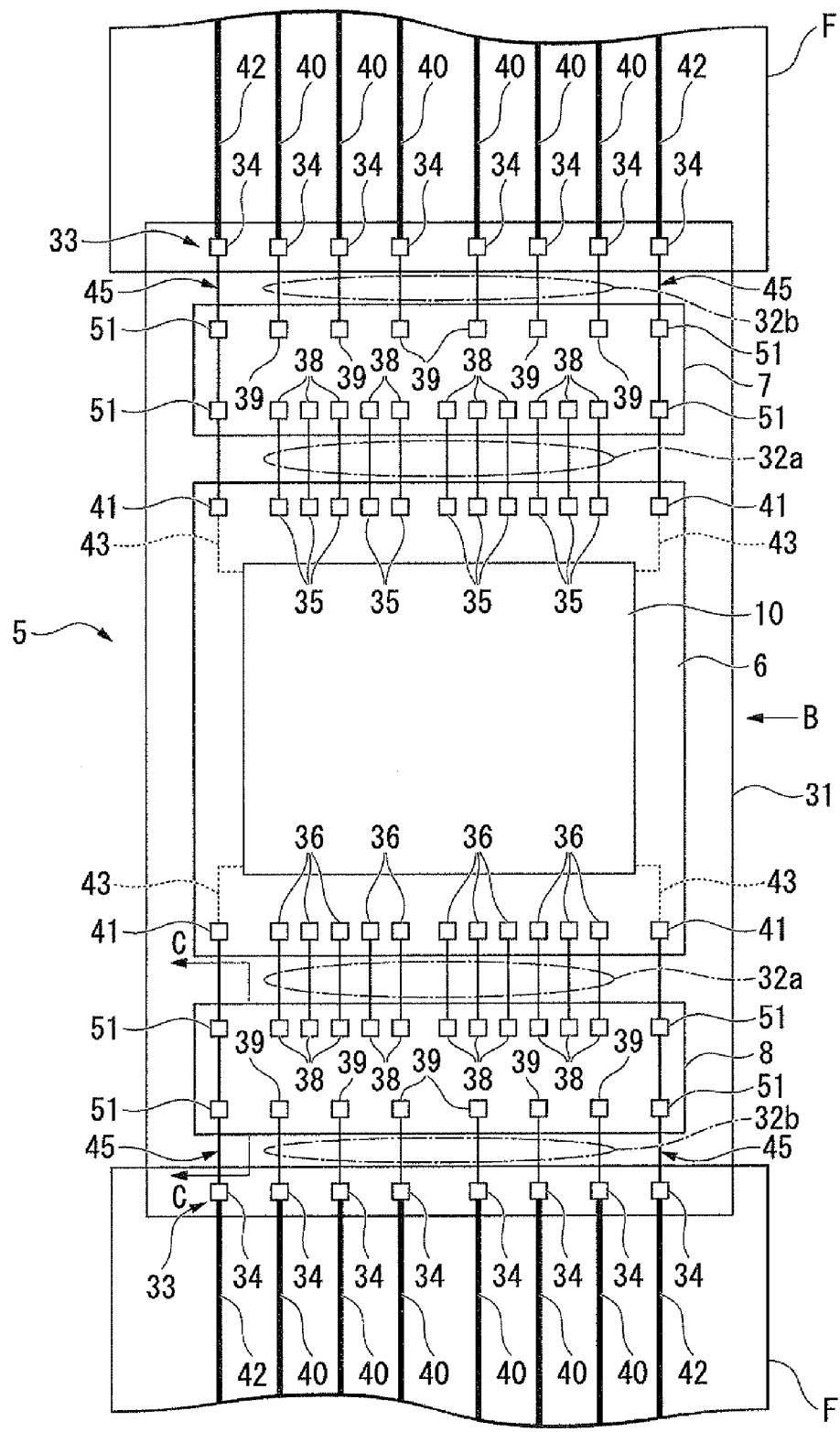
FIG. 7 is a front view showing the outline of wiring of a multi-chip module according to the embodiment of the invention.

As shown in FIG. 7, the sensor chip 6 includes a plurality of pad electrodes 35 which output the pixel signals of the odd-numbered columns of the pixel array 10 in parallel and a plurality of pad electrodes 36 which output the pixel signals of the even-numbered columns of the pixel array 10. The pad electrodes 35 of the odd-numbered columns are arranged along the edge on the upper signal processing chip 7 side, and the pad electrodes 36 of the even-numbered columns are arranged along the edge on the lower signal processing chip 8 side. In this embodiment, a plurality of signal lines (not shown) to which the pixel signals of the pixel array 10 are output are provided in the sensor chip 6, the column amplifiers 12a and 12b are disposed in the middle of the signal lines, and the pad electrodes 35 and 36 are connected to the end portions of the signal lines on the opposite side to the pixel array 10. The pad electrodes 35 and 36 are connected to one end of first wiring patterns 32a formed on the glass substrate 31 through the bumps 30 (see FIG. 6B).

The upper signal processing chip 7 and the lower signal processing chip 8 include a plurality of pad electrodes 38 arranged along the long side on the sensor chip 6 side, and a plurality of pad electrodes 39 arranged along the long side on the opposite side to the sensor chip 6. The pad electrodes 38 are connected to the other end of the first wiring patterns 32a through the bumps 30. The pad electrodes 38 are connected to the input sides of the above-described signal processing circuits, and the pad electrodes 39 are connected to the output sides of the signal processing circuits. The pad electrodes 39 are connected to one end of first wiring patterns 32b through the bumps 30.

In this way, the pad electrodes 38 are arranged along the long sides of the upper signal processing chip 7 and the lower signal processing chip 8 and disposed to face the pad electrodes 35 and 36 of the sensor chip 6, thereby connecting the first wiring patterns 32a having thousands of wiring arranged in parallel at the shortest distance. Although the first wiring patterns 32a to which the pixel signals are output from the sensor chip 6 are thousands of wiring in the odd-numbered columns or the even-numbered columns, for convenience of illustration, in FIG. 7, the first wiring patterns 32a are shown in a simplified form.

A plurality of pad electrodes 34 are arranged on the glass substrate 31 at the edge of the upper signal processing chip 7 on the opposite side of the sensor chip 6 and the edge of the lower signal processing chip 8 on the opposite side to the sensor chip 6 so as to be substantially parallel to the arrangement direction of the pad electrodes 39. A plurality of pad electrodes 34 are connected to the other end of the first wiring pattern 32b. A plurality of pad electrodes 34 form external connection terminals 33.

The flexible printed boards F which are connected to the outside the glass substrate 31 are connected to the external connection terminals 33. The flexible printed boards F integrally include a plurality of FPC wiring 40 which are flexible, substantially formed to have a linear shape, and substantially arranged in parallel. One end of a plurality of FPC wiring 40 is connected to a plurality of pad electrodes 34. Accordingly, the digitally converted pixel signals are output outside the multi-chip module 5 through the pad electrodes 34 and the FPC wiring 40.

The flexible printed boards F include FPC wiring 42 for supplying electrical signals, such as driving power of the pixel array 10, to the pixel array 10, in addition to the FPC wiring 40. Similarly to the FPC wiring 40 through which the pixel signals are output to the outside, the FPC wiring 42 is connected to the pad electrodes 34 of the external connection terminals 33. One end of second wiring patterns 45 formed on the glass substrate 31 is connected to the pad electrodes 34. The other end of the second wiring patterns 45 is connected to pad electrodes 41 as the input terminals of the sensor chip 6. The pad electrodes 41 are terminals to which electrical signals to be supplied to the pixel array 10 are input, and are connected to the pixel array 10 through signal lines 43 inside the sensor chip 6. Since the wiring patterns (the first wiring patterns 32a and 32b and the second wiring patterns 45) formed on the glass substrate 31 have restrictions on the size of the sectional area or the like, if the length is equal, the wiring patterns usually have a resistance value greater than the FPC wiring 40 or the FPC wiring 42.

Figure 8:
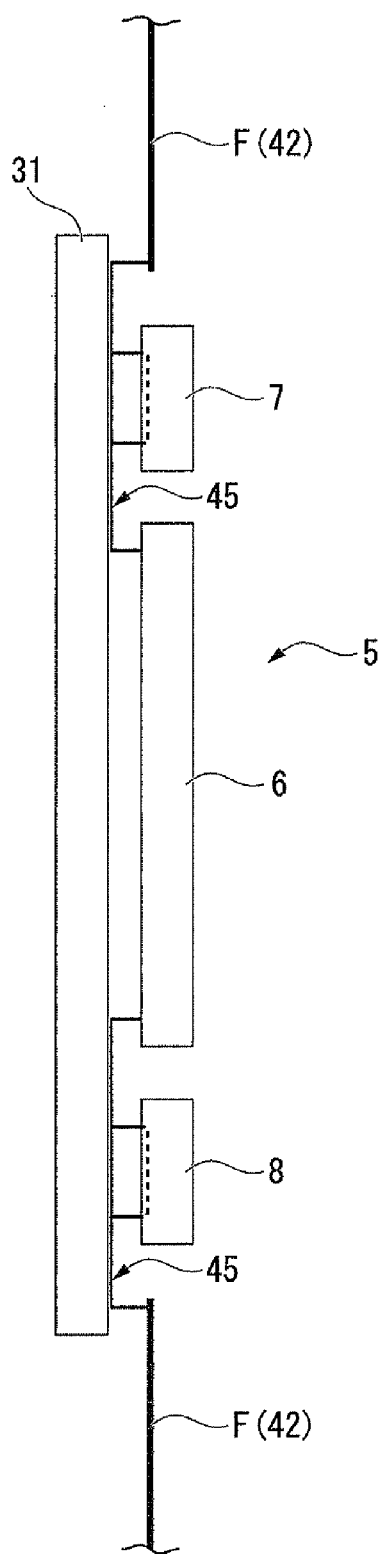
FIG. 8 is an arrow view when viewed from a B direction of FIG. 7 according to the embodiment of the invention.
Figure 9:
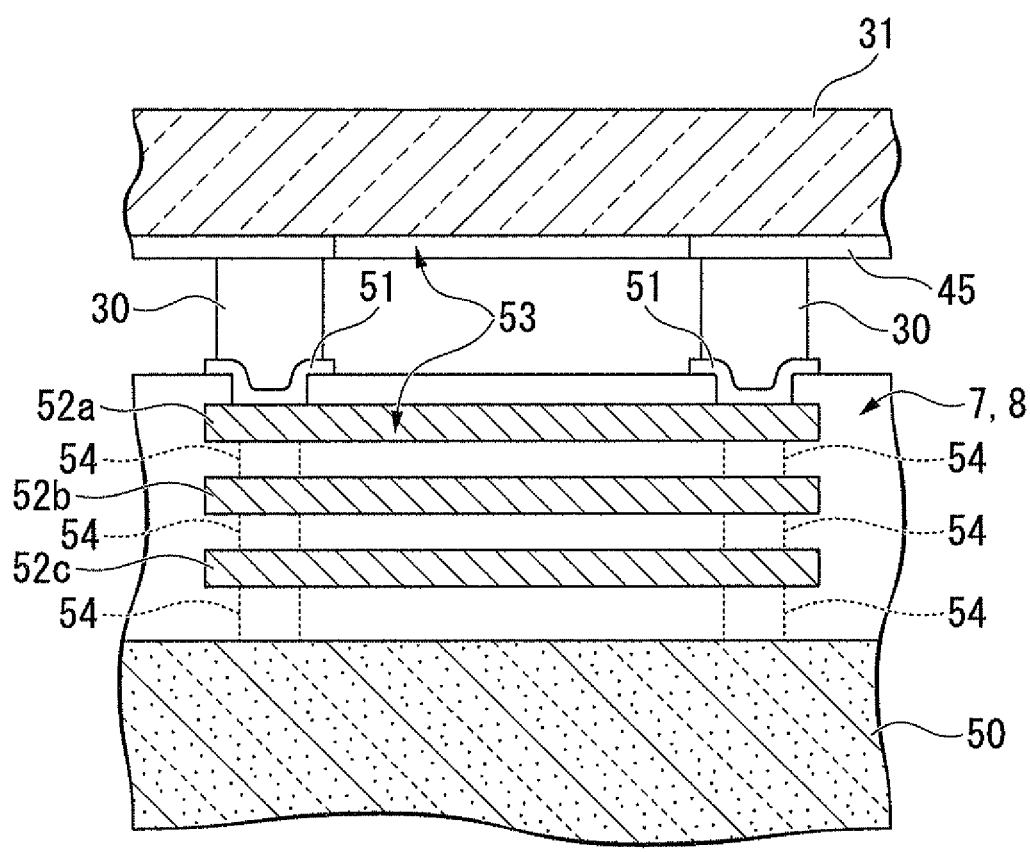
FIG. 9 is a sectional view taken along the line C-C of FIG. 7 according to the embodiment of the invention.

As shown in FIGS. 7 and 8, the second wiring patterns 45 are routed to pass above the glass substrate 31 between the upper signal processing chip 7 and the glass substrate 31 and between the lower signal processing chip 8 and the glass substrate 31. As shown in FIG. 9, bumps 30 and 30 are branched and connected in the middle of the second wiring patterns 45, and the bumps 30 and 30 are connected to two pad electrodes 51 and 51 disposed outside the upper signal processing chip 7 and the lower signal processing chip 8 in the width direction.

The upper signal processing chip 7 and the lower signal processing chip 8 are provided with a Si layer 50 in which the signal processing circuits, such as the column ADCs 20a and 20b, are formed as integrated circuits. For example, three layers of metal layers 52a to 52c are provided in the Si layer 50 on the glass substrate 31 side as a plurality of wiring layers. The metal layers 52a to 52c are formed of for example, highly conductive metal, such as aluminum (Al), and are appropriately used as internal wiring in the chip through through-holes 54. The metal layers 52a to 52c have wiring resistance per unit length lower than the second wiring patterns 45, and are used sequentially from the layer closer to the Si layer 50 as necessary. FIG. 9 shows a case where the metal layers 52b and 52c are used as internal wiring, and the metal layer 52a closest to the glass substrate 31 is not used as internal wiring.

The metal layer 52a which is not used as wiring of the integrated circuits is electrically isolated from the metal layers 52b and 52c which are used as wiring of the signal processing circuits, and are connected to the two bumps 30 and 30. Accordingly, the second wiring patterns 45 are branched from the portions connected to the bumps 30 and 30 and connected to the metal layer 52a, and the second wiring patterns 45 and the metal layer 52a are connected in parallel. That is, the second wiring patterns 45 and the metal layer 52a form a parallel portion 53. Although a case where there are three metal layers has been described as an example, the metal layers are not limited to three layers.

Accordingly, in the imaging apparatus 1 of the above-described embodiment, the sensor chip 6, the upper signal processing chip 7, and the lower signal processing chip 8 are provided on the same glass substrate 31 so as to perform a high-speed operation. The pixel signals output from the pixel array 10 of the sensor chip 6 are processed in parallel for the respective columns by the upper signal processing chip 7 and the lower signal processing chip 8, and the pixel signals processed by the upper signal processing chip 7 and the lower signal processing chip 8 are transmitted outside the multi-chip module 5 through the flexible printed boards F. When electrical signals are supplied directly to the pixel array 10 of the sensor chip 6 through the flexible printed boards F, the metal layers 52a of the upper signal processing chip 7 and the lower signal processing chip 8 disposed between the sensor chip 6 and the external connection terminals 33 are effectively used, and the metal layer 52a is connected in the middle of the second wiring patterns 45. For this reason, it is possible to reduce wiring resistance as the metal layer 52a having low resistance is used compared to a case where electrical signals are supplied to the pixel array 10 using only the second wiring patterns 45 on the glass substrate 31. As a result, it is possible to suppress deterioration in image quality due to wiring resistance without causing an increase in the size of the glass substrate 31.

The second wiring patterns 45 and the metal layer 52a are connected in parallel to form the parallel portion 53, making it possible to achieve further reduction in wiring resistance compared to a case where the second wiring patterns 45 and the metal layer 52a are connected in series.

The invention is not limited to the configuration of the imaging apparatus 1 of the above-described embodiment, and design changes may be made without departing from the gist of the invention.

For example, although in the above-described embodiment, a case where the second wiring patterns 45 on the glass substrate 31 and the metal layer 52a of the upper signal processing chip 7 and the lower signal processing chip 8 form the parallel portion 53 has been described, the invention is not limited thereto. For example, in another embodiment, when a plurality of metal layers (for example, the metal layers 52a and 52b) are not used as wiring of the signal processing circuits, the number of parallel portions 53 arranged in parallel may increase using plurality of metal layers. In this case, the metal layers (for example, the metal layers 52a and 52b) are connected together through the through-holes 54 and 54 (in FIG. 9, indicated by broken lines) or the like on both sides in the width direction.

Figure 10:
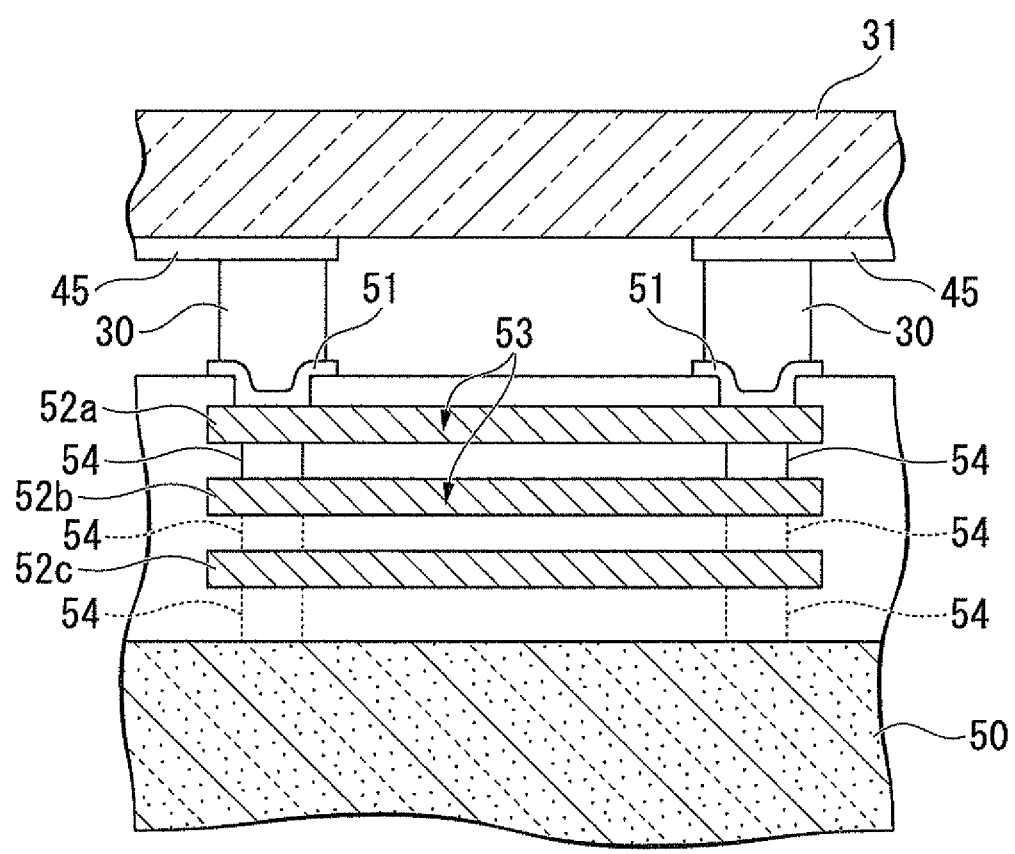
FIG. 10 is a section corresponding to FIG. 9 according to a modification of the invention.

As shown in FIG. 10, a plurality of metal layers may form the parallel portion 53, and the second wiring patterns 45 between the bumps 30 and 30 may not be provided.

Although in the above-described embodiment, a case where the parallel portion 53 is provided has been described, the invention is not limited thereto. For example, the second wiring patterns 45 and one wiring layer (for example, the metal layer 52a) may be connected in series, and the parallel portion 53 may not be provided.

Although in the foregoing embodiment, a case where the wiring layer (the metal layer 52a) is connected to the second wiring patterns 45 (power lines) for supplying driving power of the pixel array 10 has been described as an example, the invention is not limited thereto. The invention is not limited to a case where driving power is supplied, and a line into which a comparatively larger current flow may be applied. While wiring resistance increases and adverse effects occur, for example, the wiring layer (for example, the metal layer 52a) may be connected to wiring patterns (clock lines) for supplying clock signals to the sensor chip 6.

Although in the above-described embodiment, a case where the imaging apparatus is a digital single lens reflex camera has been described, the invention is not limited thereto. Alternatively and/or in addition, the imaging apparatus may be applied to, for example, a video camera, a digital compact camera, or the like.

REFERENCE SIGNS LIST

6: sensor chip
7: upper signal processing chip (signal processing chip)
8: lower signal processing chip (signal processing chip)
10: pixel array
20a, 20b: column ADC (signal processing circuit, digital converter)
21a, 21b: digital output bus (signal processing circuit)
22a, 22b: digital small-amplitude differential output circuit (signal processing circuit)
23a, 23b: bias circuit (signal processing circuit)
31: glass substrate (substrate)
32a, 32b: first wiring pattern
37: light-receiving surface
39: pad electrode (output terminal)
40: FPC wiring (first wiring)
41: pad electrode (input terminal)
42: FPC wiring (second wiring)
43: signal line
45: second wiring pattern
52a to 52c: metal layer (wiring layer)
53: parallel portion
240: FPC wiring (first wiring)
242: FPC wiring (second wiring)
245: extended wiring
247: second wiring pattern
248: pad electrode (input terminal)
250: substrate body
251: extended portion
F: flexible printed board (connection board, external connection portion)

The invention claimed is:

1. An imaging apparatus comprising:
a sensor chip having a pixel array in which a plurality of pixels are arranged to output signals according to incident light to signal lines, and input terminals to which electrical signals to be supplied to the pixel array are input;
a substrate which is disposed on a light-receiving surface side of the sensor chip, and on which first wiring patterns electrically connected to the signal lines and second wiring patterns electrically connected to the input terminals are formed;
signal processing chips which have signal processing circuits which process the signals input through the first wiring patterns, and output terminals to which the signals processed by the signal processing circuits are output; and
connection boards which have first wiring electrically connected to the output terminals of the signal processing chips and second wiring electrically connected to the second wiring patterns formed on the substrate,
wherein the pixel array includes the pixels arranged along a column direction and a row direction, and external connection portions are provided on both sides of the sensor chip in the column direction, the signal processing chips include two signal processing chips connected to the external connection portions between the sensor chip and the external connection portions, even-numbered columns of the pixel array are connected to one signal processing chip of the two signal processing chips, and odd-numbered columns of the pixel array are connected to the other signal processing chip of the two signal processing chips.

2. The imaging apparatus according to claim 1, wherein the connection boards include extended portions which extend from a body of the substrate toward the sensor chip, and the extended portions include extended wiring extending from the second wiring.

3. The imaging apparatus according to claim 1, wherein the connection boards are flexible printed boards.

4. The imaging apparatus according to claim 1, wherein the second wiring is power lines which supply power to the sensor chip.

5. The imaging apparatus according to claim 1,
wherein the second wiring is clock lines which supply clock signals to the sensor chip.

6. The imaging apparatus according to claim 1,
wherein the pixel array includes the pixels arranged in a lattice shape, and the signal processing chips process the signals output from the pixel array in parallel.

7. The imaging apparatus according to claim 1,
wherein the signal processing chips include a plurality of digital converters which digitally convert electrical signals from the columns of the pixel array.

8. The imaging apparatus according to claim 2,
wherein the extended portions extend to reach a lateral side of the sensor chip.

9. The imaging apparatus according to claim 2,
wherein the extended portions extend to reach both lateral sides of the sensor chip.

10. An imaging apparatus comprising:
a sensor chip having a pixel array in which a plurality of pixels are arranged to output signals according to incident light to signal lines, and input terminals to which electrical signals to be supplied to the pixel array are input;
a substrate which is disposed on a light-receiving surface side of the sensor chip, and on which first wiring patterns electrically connected to the signal lines and second wiring patterns electrically connected to the input terminals are formed;
signal processing chips which have signal processing circuits which process the signals input through the first wiring patterns, output terminals to which the signals processed by the signal processing circuits are output, and wiring layers which are electrically connected to the second wiring patterns; and
external connection portions which have first wiring electrically connected to the output terminals of the signal processing chips and second wiring electrically connected to the second wiring patterns formed on the substrate,
wherein the pixel array includes the pixels arranged along a column direction and a row direction, and the external connection portions are provided on both sides of the sensor chip in the column direction, the signal processing chips include two signal processing chips provided between the sensor chip and the external connection portions, even-numbered columns of the pixel array are connected to one signal processing chip of the two signal processing chips, and odd-numbered columns of the pixel array are connected to the other signal processing chip of the two signal processing chips.

11. The imaging apparatus according to claim 10,
wherein the second wiring patterns and the wiring layers are connected in parallel together.

12. The imaging apparatus according to claim 10,
wherein the signal processing chips have a plurality of wiring layers, two or more wiring layers are connected in parallel together, and the two or more wiring layers connected in parallel together are connected to the second wiring patterns.

13. The imaging apparatus according to claim 10,
wherein the external connection portions are flexible printed boards.

14. The imaging apparatus according to claim 10,
wherein the second wiring patterns are power lines which supply power to the sensor chip.

15. The imaging apparatus according to claim 10,
wherein the second wiring patterns are clock lines which supply clock signals to the sensor chip.

16. The imaging apparatus according to claim 10,
wherein the pixel array includes the pixels arranged in a lattice shape, and the signal processing chips process the signals output from the pixel array in parallel.

17. The imaging apparatus according to claim 10,
wherein the signal processing chips include a plurality of digital converters which digitally convert the signals from the columns of the pixel array.

18. An imaging apparatus comprising:
a sensor chip that has
a first pixel that generates a first signal by an incident light,
a second pixel that generates a second signal by the incident light,
a first signal line that is connected to the first pixel and outputs the first signal, and
a second signal line that is connected to the second pixel and outputs the second signal;
a first signal processing chip that
is a semiconductor device different from the sensor chip, and
has a first signal processing circuit that is connected to the first signal line and performs a signal processing of the first signal; and
a second signal processing chip that
is a semiconductor device different from the sensor chip, and
has a second signal processing circuit that is connected to the second signal line and performs a signal processing of the second signal,
wherein the first and second signal processing chips are disposed on opposite sides of the sensor chip.

19. The imaging apparatus according to claim 18, wherein
the sensor chip has a pixel array where the first pixel and the second pixel are disposed, and
the first signal processing circuit and the second signal processing circuit are disposed around the pixel array.

20. The imaging apparatus according to claim 18, further comprising:
a substrate that has
a first wiring that connects the first signal line and the first signal processing circuit, and
a second wiring that connects the second signal line and the second signal processing circuit.

21. The imaging apparatus according to claim 18, wherein
the first signal processing circuit includes a first converter that converts the first signal into a digital signal, and
the second signal processing circuit includes a second converter that converts the second signal into a digital signal.

22. The imaging apparatus according to claim 19,
wherein the pixel array is disposed between the first signal processing circuit and the second signal processing circuit.

23. The imaging apparatus according to claim 19,
wherein the first pixel and the second pixel are alternately disposed in the pixel array of the sensor chip.

24. The imaging apparatus according to claim 21, further comprising:
a first connection substrate that has a third wiring that outputs the first signal converted into the digital signal by the first signal processing circuit; and a second connection substrate that has a fourth wiring that outputs the second signal converted into the digital signal by the second signal processing circuit.

25. The imaging apparatus according to claim 21, wherein at least the first connection substrate out of the first connection substrate and the second connection substrate has a fifth wiring that supplies power for driving the sensor chip.

* * * * *